United States Patent [19]

Daniels et al.

[11] Patent Number: 4,680,613
[45] Date of Patent: Jul. 14, 1987

[54] LOW IMPEDANCE PACKAGE FOR INTEGRATED CIRCUIT DIE

[75] Inventors: Wilbert E. Daniels, West Buckston; Dana J. Fraser, South Portland, both of Me.

[73] Assignee: Fairchild Semiconductor Corporation, Palo Alto, Calif.

[21] Appl. No.: 557,119

[22] Filed: Dec. 1, 1983

[51] Int. Cl.⁴ .................. H01L 23/48; H01L 23/30
[52] U.S. Cl. .................................. 357/72; 357/70; 357/68
[58] Field of Search ............... 357/70, 72, 81, 75, 357/89, 68, 74

[56] References Cited

U.S. PATENT DOCUMENTS

| | | | |
|---|---|---|---|
| 4,023,053 | 5/1977 | Shimizu et al. | 357/70 |
| 4,177,480 | 12/1979 | Hintzmann et al. | 357/72 |
| 4,252,864 | 2/1981 | Coldren | 357/70 |
| 4,454,529 | 6/1984 | Philofsky et al. | 357/70 |
| 4,459,607 | 7/1984 | Reid | 357/70 |
| 4,514,750 | 4/1985 | Adams | 357/70 |
| 4,521,828 | 6/1985 | Fanning | 357/70 |
| 4,551,746 | 11/1985 | Gilbert et al. | 357/81 |

FOREIGN PATENT DOCUMENTS 55-48956   4/1980   Japan ..................... 357/70

OTHER PUBLICATIONS

Thermal Characteristics of 16 and 40 Pin Plastic DIL Packages by James A. Andrews, L. M. Mahalingam and Howard M. Berg, Motorola Semiconductor Group, 5005 E. McDowell Road, Phoenix, Ariz. 85008.
Automated Packaging of a Premolded Chip Carrier, by Dimity Grabbe, AMP Inc., Harrisburg, Pa. and Alan Keizer, The Jade Corporation, Huntingdon Valley, Pa.

*Primary Examiner*—Andrew J. James
*Assistant Examiner*—S. V. Clark
*Attorney, Agent, or Firm*—Steven J. Phillips; David H. Carroll; Daniel H. Kane, Jr.

[57] ABSTRACT

A low inductive impedance dual in-line package for an integrated circuit die incorporates a lead frame formed with a central opening without a die attach paddle. A ground plate forms the die attach plane spaced from and parallel with the lead frame. A dielectric layer is formed between the lead frame and ground plate. The lead frame is formed with a ground lead finger electrically coupled in parallel with the ground plate thereby providing a ground path through the ground plate with planar configuration to minimize inductive impedance to ground current and to minimize cross coupling between the electrically active lead fingers of the lead frame. In the preferred embodiment, the lead frame and ground plate are initially supported in a spaced parallel plane relationship by complementary spacing tab elements. During encapsulation, the encapsulation molding compound is introduced between the lead frame and ground plate to form the dielectric layer. A low impedance lead frame is also described in which the power lead finger and ground lead finger are at least 2.5 times wider than the signal lead finger for cooperating with the ground plane and for minimizing inductive reactance to power currents and ground currents. The package may be further stabilized by incorporating an internal decoupling capacitor. The invention is particularly applicable to dual in-line packages (DIP'S) and provides a method for extending DIP technology for high speed low inductance applications.

27 Claims, 23 Drawing Figures

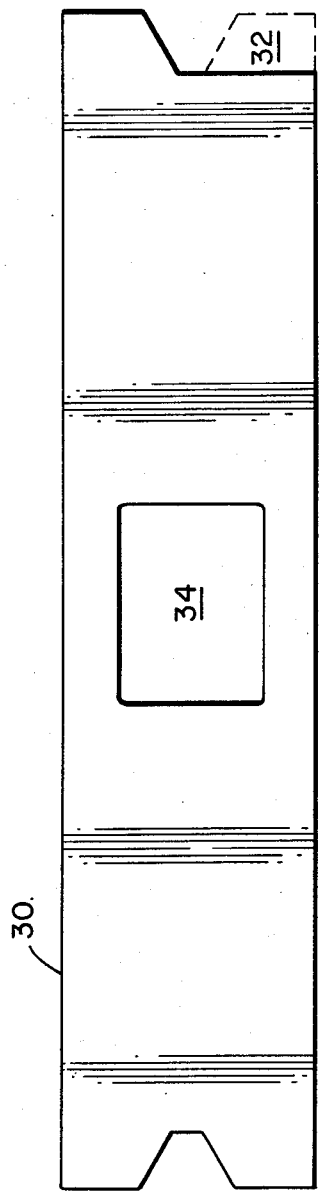
FIG. 6
FIG. 6A

LOW IMPEDANCE PACKAGE FOR INTEGRATED CIRCUIT DIE

TECHNICAL FIELD

This invention relates to a new lead frame package for an integrated circuit chip or die and to the method of packaging. In particular, the invention provides a new low inductive impedance dual in-line package, lead frame, and packaging method.

BACKGROUND ART

The conventional dual in-line package (DIP) comprises an elongate lead frame with, for example, up to forty or more pins or leads arranged in dual parallel rows. The integrated circuit chip or die is attached by bonding to a "paddle" supported at the center of the lead frame by paddle support fingers. Lead frame fingers or traces including a power lead finger, ground lead finger, and signal lead fingers extend radially from the open perimeter around the paddle to the dual parallel rows of pins. The fingers and leads or pins generally comprise unitary conductive paths which, in the DIP may extend for considerable length from the center of the lead frame to the elongate ends. The entire package, except leads, is enclosed in encapsulation molding compound and a flow coating may be formed and cured over the die for environmental protection of the die prior to encapsulation molding.

The long parallel lines or runs of adjacent conductive strips or traces formed by the lead frame fingers extending to the elongate ends particularly in larger DIP'S exhibit substantial inductance and inductive coupling and may result in high inductive impedance to signal currents. The long ground lead to the end of the DIP is particularly vulnerable in this respect because of the relatively large currents which must pass through the ground lead to or from multiple signal leads. The inductive impedance significantly retards signal propagation causing signal delay, and "ground bounce" from rapid ground current changes following transients at either the power lead $V_{cc}$ or the signal leads. The inductive coupling between long lines of the standard DIP also results in cross talk or cross coupling between signals and consequent noise.

As explained, for example, in "The Impact of Inductance on Semiconductor Packaging", by Leonard W. Schaper, Bell Laboratories, Murray Hill, New Jersey, published in the *First Annual Conference of the International Electronics Packaging Society* (IEPS), Cleveland, Ohio, pp. 38-43, November 9-10, 1981, the major inductance problem is in the power and ground leads, since these carry the large transient currents generated by the switching of many logic circuit gates at once. Furthermore, the different logic circuit gates of the chip or die have different transient characteristics. The inductance of the lead frame fingers is proportional to the length and inversely proportional to the width of the traces. The inductance of the leads or traces leading to the power supply and ground at the ends of the DIP are so great that it may be impossible for significant leading edge current to come from the supply. As a result, bypass capacitors in the external circuitry may be used to supply current. Current transients in the lead or trace inductors between the decoupling capacitor and the power supply produce transient voltage drops which applied across the capacitors generate the desired leading edge switching current. Generally such bypass capacitors are located outside the package in the external circuitry.

A disadvantage of the use of external bypass or decoupling capacitors is that the capacitors must also compensate for the inductance of leads and circuits at the external circuitry associated with the DIP package. Another disadvantage of the external decoupling capacitor is that the decoupling capacitor is between the power supply lead and ground only and can not compensate for inductances when the current transient is between the multiple signal leads and ground.

With increased switching speeds and rate of current change, the transient voltages and consequent inductive impedance in the leads or traces also increases. Greater use of parallel architecture and common bus architecture in the integrated circuits also increases the number of logic circuit gates changing simultaneously thereby increasing the transient voltages across the leads and the effect of inductive reactance. The result is even slower useable signal speed propagation, and increased "ground bounce" from rapid ground current changes caused by the power supply or signal leads.

Another disadvantage of conventional DIP packaging is the slow dissipation or removal of heat generated at the chip or die as a result of the relatively high thermal resistance of the packaging material. Heat generated on the surface of the die passes through the encapsulation molding material to ambient air and through the leads and prongs. Heat removal problems result in a hot spot in the center of the packaging shortening the life of the integrated circuit chip or die. As a general rule, the life of the device is, for example, halved for each 10° C. increase in operating temperature.

For more complex chips such as a microprocessor in a longer package with, for example, forty pins or leads, a high thermal conductivity heat spreader such as a metal heat plate may be inserted below the lead frame in the encapsulation molding compound material. As a general rule, however, the heat generated at the die must still pass through a layer of molding compound to the heat spreader. Such heat spreaders are described, for example, by James A. Andrews, L. M. Mahalingam, and Howard M. Berg, "Thermal Characteristics of 16 and 40 PIN Plastic DIL Packages", IEEE (1981) (Publication CH 1671-7/81/0000-0136). Such a heat spreader may conduct heat from just below the chip over the entire area of the lead frame package.

These thermal characteristics of low heat dissipation and the electrical characteristics of slow signal speed, ground bounce, and noise, limit the applicability and usefulness of DIP packaging for the faster bipolar chips. Because of these limitations, the traditional DIP packaging is unable to match the faster chip technology now available.

OBJECTS OF THE INVENTION

It is therefore an object of the present invention to provide a new low inductive impedance DIP type package for integrated circuit chips and dies.

Another object of the invention is to reduce the thermal limitations of thermal resistance and the electrical limitations on signal speed, ground bounce and noise in order to extend the technology of DIP packaging to match faster chip technology presently available. Thus, the invention seeks to provide greater efficiency in heat removal, greater signal speed, and reduced ground bounce and noise in the context of traditional DIP packaging configurations.

A further object of the invention is to provide in DIP packaging a novel low impedance lead frame, and a novel ground plate which forms both a die attach plane and a ground lead of planar configuration for minimizing inductive impedance to ground current. The invention also seeks to further stabilize operation of integrated circuits bearing large or rapid $V_{cc}$ power and ground current changes and to conduct current out of the package as quickly as possible.

Another object of the invention is to reduce cross talk or cross coupling between signal input or output leads by significantly reducing the inductance and inductive coupling between signal leads of the lead frame.

DISCLOSURE OF THE INVENTION

In order to accomplish these results, the present invention provides an improved low inductive impedance dual in-line package for an integrated circuit die incorporating an elongate lead frame formed with a central opening but without a die attach paddle in the central opening and without paddle supports. A ground plate forms the die attach plane, parallel with and spaced from the lead frame. The lead frame is formed with a plurality of electrically active lead fingers including a ground lead finger, power lead finger, and signal lead fingers all lying in a common plane at the perimeter of the central opening of the lead frame. A dielectric layer is formed between the lead frame and ground plate. However, electrical contact is made between the ground lead finger of the lead frame and the ground plate. The die round terminal or pad of a chip or die attached to the ground plate is also down bonded to the ground plate. A feature and advantage of this DIP configuration is that the package ground plate provides a ground lead with effective planar configuration to minimize inductive impedance to ground current and to minimize cross coupling between the electrically active lead fingers.

In a preferred embodiment of the invention the lead frame and ground plate are supported and maintained in a separated or spaced parallel plane relationship by forming complementary spacing tab attach portions and offset spacing tabs on the lead frame and ground plate. For example, the lead frame is formed with a plurality of spacing tab attach portions isolated from the electrically active lead fingers so that the spacing tab attach portions are rendered electrically inactive upon final trimming and forming of the package. The ground plate is formed with a set of complementary offset spacing tabs at locations on the ground plate corresponding to the tab attach locations of the lead frame for bonding of the offset spacing tabs to the spacing tab attach portions. A feature and advantage of this arrangement is that the spacing tab elements are isolated from the electrically active lead fingers and are rendered electrically inactive during the final trimming and forming of the package. For example, the spacing tab attach portions of the lead frame are supported by the rails at the end of the lead frame. The rails are trimmed and removed during final trimming and forming of the package thereby severing any electrical connection between the spacing tab attach portions and the electrically active lead fingers.

In the preferred embodiment of the invention electrical contact between the ground lead finger and ground plate is accomplished by forming the ground lead finger with a ground tab attach element electrically continuous with the ground lead finger. The ground plate is formed with an offset ground tab bonded to the ground tab attach element of the ground lead finger. The ground tab attach element is notched relative to the ground lead finger for resilient motion of the ground tab attach element relative to the ground lead finger so that offset ground tab on the ground plate may be bonded to the ground tab attach element without substantially displacing the ground lead finger from the common plane of the electrically active lead fingers.

According to another example embodiment the ground lead finger itself is formed with an offset ground tab or downset ground tab which is bonded to a location on the ground plate in order to provide the electrical contact between the ground lead finger and ground plate.

In the preferred package configuration and method in which the ground plate and lead frame are supported and maintained in spaced apart coplanar or parallel relationship by complementary spacing tab elements, electrically inactive and isolated from the lead fingers, an integrated circuit chip or die is bonded to the ground plate at the central opening in the lead frame. Electrical interconnects or wires are bonded between die pads on the integrated circuit chip and the lead frame fingers. The die ground terminal is also interconnect bonded to the ground plate. The ground lead finger and ground plate therefore provide parallel coupled ground paths. For encapsulation, encapsulation molding compound is introduced between the lead frame and ground plate to form the dielectric layer while the encapsulation molding compound is also molded around the package. The encapsulation step may be preceded by flow coating a room temperature vulcanized rubber over the die for environmentally protecting the die.

In an alternative example embodiment the ground plate and lead frame are maintained and supported as separate parallel planes spaced apart by forming the dielectric layer as a separate dielectric sheet or plate and inserting, laminating or bonding the dielectric sheet between the ground plate and lead frame. The dielectric sheet is formed with a central opening in alignment with the central opening of the lead frame for defining a cavity over the ground plate for receiving an integrated circuit die. The integrate circuit die or chip is bonded to the ground plate in the cavity and lead wires are bonded between the die and the electrically active lead fingers. The die ground terminal is also interconnect bonded to the ground plate. In this arrangement the flow coating for environmentally protecting the die may fill the cavity covering the die and lead wires. The encapsulation molding compound is then molded around the package.

According to either the preferred example embodiments or alternative example embodiments, the power lead finger may be formed with an opening or cutout and a downset tab adjacent the cutout for receiving a decoupling capacitor inside the package. The ground plate is also formed with an opening in alignment with the power lead finger cutout so that the downset tab of the power lead finger is downset in the aligned opening without contacting the ground plate. The decoupling capacitor is seated in the aligned power lead finger cutout and ground plate opening with a first terminal in electrical contact with the power lead finger downset tab and a second terminal in electrical contact with the ground plate. When encapsulation molding compound is introduced between the lead frame and ground plate the dielectric layer fills in around the decoupling capacitor. When a separate dielectric layer or sheet is used, the dielectric sheet is formed with an offset second opening in alignment with the power lead finger cutout and ground plate opening for accommodating the decoupling capacitor.

A feature and advantage of this arrangement is that the decoupling capacitor is contained within the package itself, closer to the chip, thereby minimizing the series inductance of leads across which undesired voltages are generated. The decoupling or bypass capacitor from $V_{cc}$ to ground between the power lead finger and the ground lead finger thereby more effectively reduces ground bounce from rapid ground current changes and stabilizes the $V_{cc}$ to ground voltage.

The invention also contemplates a new low inductance lead frame for dual in-line packages with the foregoing structural features and the manufacturing methods and steps for producing the alternative example embodiments of the improved DIP package of the present invention. In the improved lead frame the power lead finger and ground lead finger are formed at least 2.5 times wider than the signal lead fingers along a portion of the respective lengths of the lead fingers thereby operating in conjunction with the ground plate for reducing inductive impedance to power current and ground current. The ground lead finger and ground plate function as parallel coupled conductors of planar configuration for even lower impedance to ground current. In the preferred example embodiment the lead frame includes the electrically isolated spacing tab elements such as the spacing tab attach portions isolated from the electrically active lead fingers and also includes the ground tab element, for example, the ground tab attach portion continuous with the ground lead finger. The ground tab attach portion or element is notched relative to the ground lead finger for resilient motion relative to the ground lead finger so that an offset ground tab may be bonded to the ground tab attach element without displacing the ground lead finger from the common plane of the electrically active lead fingers.

A feature and advantage of the new lead frame in combination with the ground plate of the present invention is that currents in the power lead finger and ground lead finger and signal fields in the signal lead fingers are imaged in the ground plate rather than in adjacent leads thereby minimizing cross coupling, cross talk and noise in the signal leads.

The invention also contemplates the manufacturing methods for packaging integrated circuit chips in the low inductive impedance dual in-line packages of the invention.

Other objects, features and advantages of the present invention are apparent in the following specification and accompanying drawings.

BRIEF DESCRIPTION OF DRAWINGS

FIG. 6 is a plan view and FIG. 6A a side view of a dielectric layer for separating and spacing the lead frame and ground plate.

DESCRIPTION OF PREFERRED EXAMPLE EMBODIMENTS AND BEST MODE OF THE INVENTION

Figure 1:
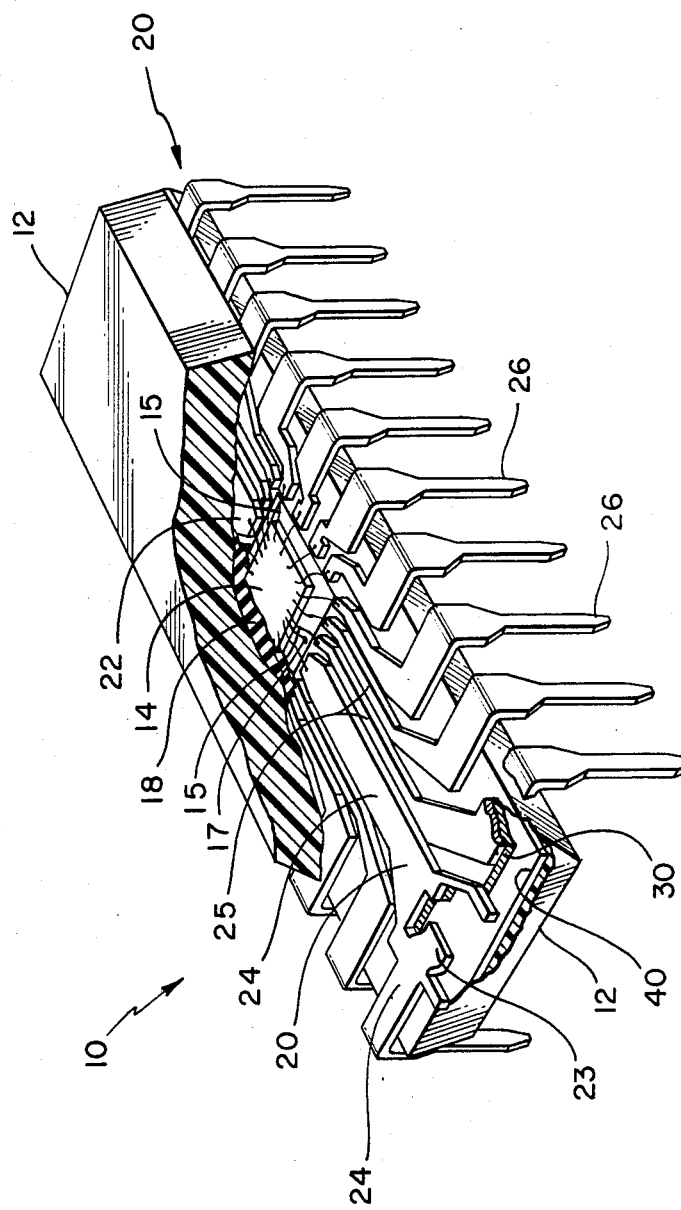
FIG. 1 is a perspective view partially cut away of a low impedance plastic dual in-line package (DIP) for packaging an integrated circuit chip or die according to the invention.
Figure 2:
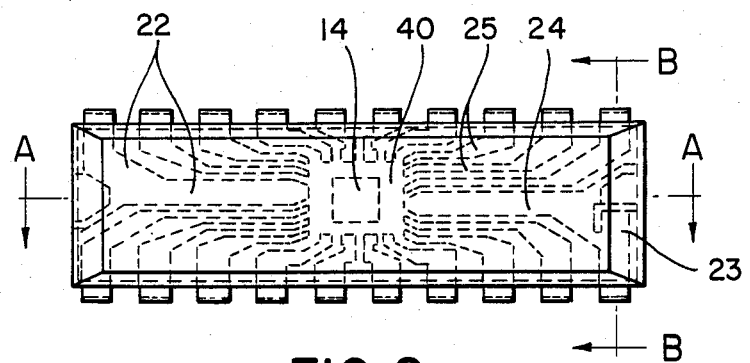
FIG. 2 is a plan view of the DIP showing major internal elements of the package in phantom outline.
Figure 2A:
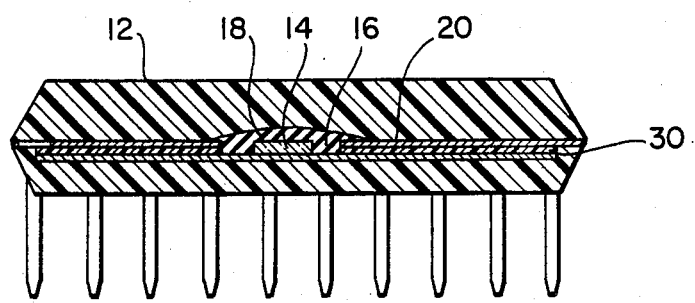
FIG. 2A is a side cross section through the package in the direction of the arrows on line A—A of FIG. 2.
Figure 2B:
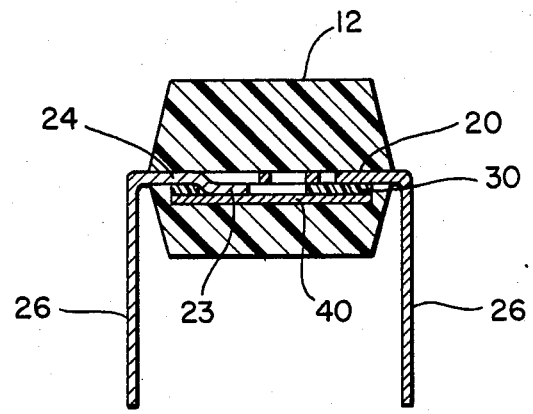
FIG. 2B is an end cross section through the package in the direction of the arrows on line B—B of FIG. 2.

A low impedance plastic dual in-line package (DIP) 10 according to the invention is illustrated in FIGS. 1, 2, 2A, and 2B. The DIP is formed with an outer encapsulation molding 12 which encloses a lead frame 20, dielectric layer or separator 30 and ground plate or ground plane 40 spaced from the lead frame 20 by the dielectric layer 30. As hereafter more fully described, the lead frame 20 is formed with a central opening without a die attach paddle or paddle supports and the dielectric layer 30 is also formed with a central opening in alignment with the central opening of lead frame 20 forming a cavity 16 so that a chip or die 14 may be bonded directly to the ground plate 40 which forms a die attach plane. A plurality of lead interconnects or wires 15 are bonded between die pads of the chip 14 and lead frame fingers of lead frame 20. Lead interconnect or wire 17 is down bonded from the ground terminal or pad of the die 14 to silver clad area or portion 44 of ground plate 40. The central cavity 16 formed by the aligned central openings in lead frame 20 and dielectric layer 30 is filled with a flow coating, for example, of room temperature vulcanized (RTV) rubber encapsulent 18 coating and protecting the chip and bonded lead wires.

Lead frame 20 is formed with a central opening and a plurality of lead frame fingers lying in a common plane and extending generally radially at the periphery of the central opening. The lead frame fingers include a power lead finger or finger portion 22, a ground lead finger or finger portion 24 and a plurality of signal lead fingers or finger portions 25. Pins or prongs 26 corresponding to each of the lead frame fingers or finger portions project at right angles from the encapsulation molding 12 for insertion into a socket or a circuit board. The ground lead finger 24 is formed with a tab 23 which is downset and spot welded in electrical contact with ground plate 40 through an aligned opening or cutout in dielectric layer 30 at the end of the ground lead finger 24 and ground plate 40 where ground current enters the package. Downset tab 23 and down bond wire or interconnect 17 electrically couple the ground lead finger 24 and ground plate 40 in parallel ground paths. As a result, the wide planar configuration associated with the ground lead and ground plate minimizes inductance and inductive impedance. Furthermore, the ground plate configuration substantially coextensive in area with the common plane of the lead frame minimizes ground bounce or variation of ground voltage relative to the power voltage $V_{cc}$ due to rapidly changing switching currents or transients in the signal lead fingers or rapid changes or transients at the power source.

A feature and advantage of the DIP is that the chip or die 14 is bonded by electrically and thermally conducting die attach compound such as silver filled polyamide directly to the ground plate 20 which forms an efficient heat conducting and heat dissipation plane for distributing and dissipating heat generated on the surface of the die. Heat distributed through the high thermal conductivity low thermal impedance metal ground plane further propagates through the encapsulation molding material to the ambient air and further through the dielectric layer, lead frame and high thermal conductivity pins or leads 26 into the socket and circuit board. The ground plate therefore forms an efficient heat dissipating structure within the package which reduces the occurrence of "hot spots" and lowers the all over temperature increase at the surface of the die greatly extending the life of the chip. Typically, the life of the chip is doubled for every 10° C. lowering of operating temperature. Such a doubling of the die life is achievable with the package configuration of the present invention. At the same time, functioning as a ground plane, the ground plate minimizes inductive reactance to the cumulative current from switching transients at multiple signal leads with reduced choking or delaying of the ground current passing through the ground lead finger 24. Choking of the ground current and consequent delay in circuit operation is thereby reduced so that the DIP may be extended for use with faster bipolar chips.

Figure 3:
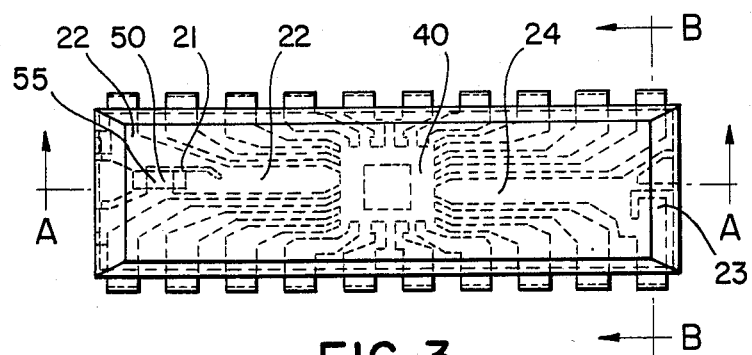
FIG. 3 is a plan view of an alternate package configuration according to the invention incorporating an internal decoupling capacitor showing major internal elements of the package in phantom outline and showing the location of the decoupling capacitor.
Figure 3A:
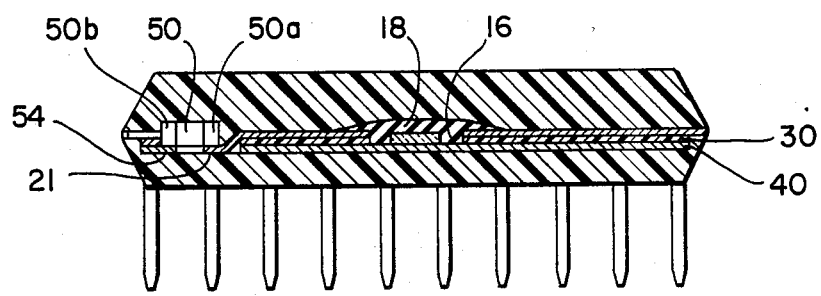
FIG. 3A is a side cross section of the package of FIG. 3 in the direction of the arrows on line A—A.
Figure 3B:
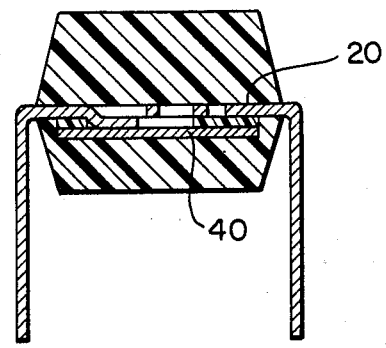
FIG. 3B is an end cross section of the package of FIG. 3 in the direction of the arrows on line B—B.

In the alternate package configuration of FIGS. 3, 3A and 3B, a decoupling capacitor or bypass capacitor 50 is incorporated internally. The elements of the DIP in FIGS. 3, 3A, and 3B are the same as those set forth in FIGS. 2, 2A and 2B except as follows. The power lead finger 22 differs in being formed with an opening or cutout opening 55 with a power lead finger tab 21 adjacent to the opening. The ground plate 40 and dielectric layer 30 are formed with aligned openings offset from the center and in alignment with the power lead finger cutout opening so that the tab 21 may be downset into the aligned openings without contacting the ground plate 40 as shown in FIG. 3A and all as hereafter more fully described. The decoupling capacitor 50 is seated in the aligned openings with one terminal 50a in electrical contact with the downset tab 21 and the other terminal 50b in electrical contact with a surface edge of ground plate 40. As shown in FIG. 3A the offset opening in dielectric layer 30 is slightly larger an area than the offset opening in ground plate 40 leaving an exposed surface edge 54 for electrical contact with the terminal 50b of decoupling capacitor 50.

Figure 4:
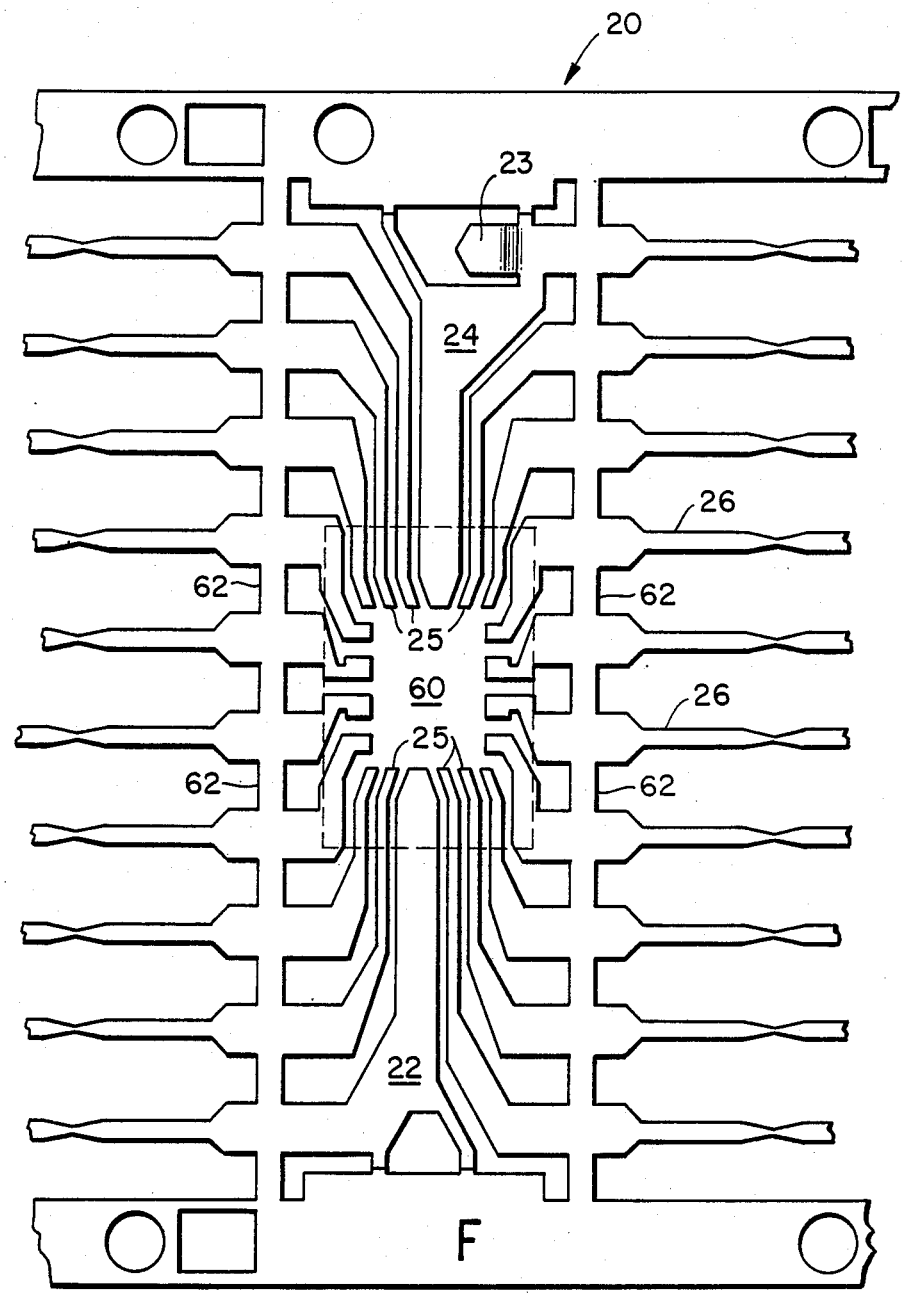
FIG. 4 is a plan view of a new low impedance lead frame for use in the DIP and packaging method of the present invention.

The novel low impedance lead frame 20 according to the present invention is illustrated in FIG. 4. The lead frame 20 is formed with a central opening 60 around which a plurality of lead frame fingers extend radially from the perimeter in a common plane. The lead frame fingers are supported by lead frame dams 62 which are of course subsequently removed or cut away during the packaging sequence. The lead frame dams 62 also support the pins or prongs 26 corresponding to each of the lead frame fingers.

The lead frame fingers include, as heretofore described, a ground lead finger or ground lead finger portion 24, a power lead finger or power lead finger portion 22 and a plurality of signal lead fingers or signal lead finger portions 25. The ground lead finger 24 is provided with a tab 23 which is downset for electrical contact as, for example, by spot welding to the ground plate of the present invention. As shown in FIG. 4, the ground lead finger 24 and power lead finger 22 extend from the ends of the elongate lead frame in the elongate direction and along with adjacent signal lead fingers 25 are therefore subject to the greatest inductance by reason of length. As a result, according to the invention, the ground lead finger 24 and power lead finger 22 because they carry the greatest currents and experience the greatest current transients and current changes (di/dt) are expanded or extended in width to provide a greater width relative to length to minimize inductance. Because inductance is proportional to length relative to width and approaches a minimum as a planar configuration is achieved, the lead frame configuration, particularly in combination with the parallel coupled ground plate, minimizes inductance within the spatial and structural limitations of a DIP lead frame. In fact it has been found that inductance may be reduced within the structural and spatial constraints of the DIP lead frame by expanding the power lead finger 22 and ground lead finger 24 to a width greater than 2.5 times the width of the adjacent elongate signal lead fingers 25 and by addition of the current carrying ground plane or plate. In the configuration of the lead frame of FIG. 4, inductive reactance in the ground lead finger 24 and power lead finger 22 are minimized within the constraints of the lead frame structure.

For example in the lead frame of FIG. 4, the elongate portion of the ground lead finger 24 and power lead finger 22 may be formed with a width of approximately 2.5 times the elongate portion of the signal lead fingers 25 which are formed with a width of, for example, 12 mils (0.3 mm). The greatly extended width of the ground lead finger 24 and power lead finger 22 of the low impedance lead frame of the present invention, particularly in conbination with the ground plate or plane, is to be contrasted with the conventional lead frame ground and power lead fingers having a width of, for example, 13 mils 0.33 mm). The conventional lead frame formed with a die attach paddle at the central opening 60 with die attach support fingers on either side would prohibit the planar expansion of the ground and power lead fingers.

Figure 5:
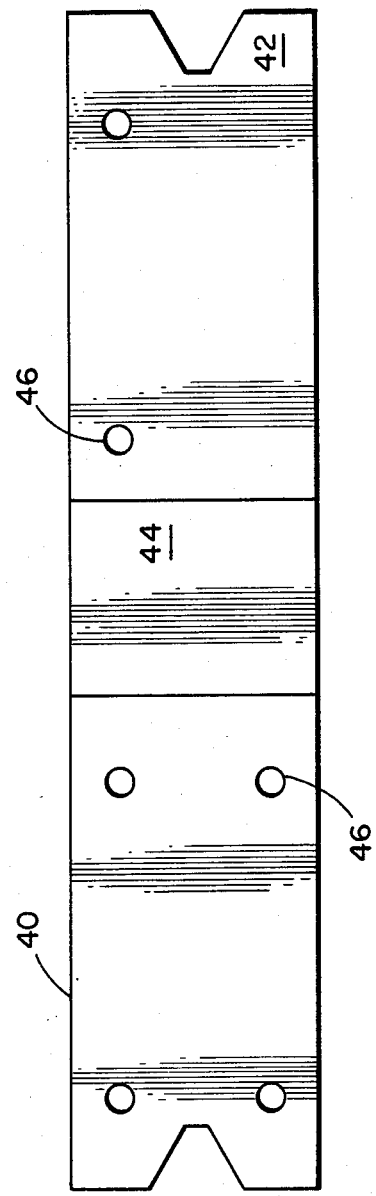
FIG. 5 is a plan view and FIG. 5A a side view of a ground plate for use with the lead frame of FIG. 4 in the DIP and packaging method.
Figure 5A:

The ground plate 40 suitable for use in the DIP of FIG. 1 is illustrated in FIGS. 5 and 5A. The area of ground plate 40 is substantially coextensive with the common plane or common plane portion of the lead frame of FIG. 4 extending, for example, to the outer sides of the lead frame dams 62 shown in FIG. 4. Thus, the ground plate may be, for example, 200 mils wide. By this dimensional matching, the ground plate offers three advantages. First, it offers a wide ground current path parallel to the ground lead. Second, it offers ground plate imaging for all signals and currents passing in the lead frame fingers. The ground plate is of course coupled to the ground lead finger portion 24 of the lead frame by a downset tab 23 which is typically spot welded to the ground plate location, for example 42, illustrated in FIG. 5. A central band 44 of ground plate 40 is clad, for example, with silver on a nickel underlay for improved electrical conductivity where the die or chip is attached by bonding to the ground plate and for improved electrical contact of the down bond wire or interconnect 17 between a chip or die ground pad and the ground plate. Thus, ground plate 40 forms the die attach plane and the chip is bonded to the plane with die attach compound which is both electrically and thermally conductive. Ground plate 40 is also formed with a number of thru holes 46 to facilitate molding of a dielectric layer to the ground plate where a molding method is used instead of lamination of a prefabricated dielectric layer as hereafter described. Third, the ground plate distributes heat for efficient dissipation across the entire surface of the package and through all pins.

A plastic laminate dielectric layer 30 for incorporation into the package of FIG. 1 is illustrated in FIG. 6 and 6A. The prefabricated dielectric sheet or layer 30 is preformed with a central cutout or opening 34 in alignment with the central opening 60 of the lead frame 20 illustrated in FIG. 4. The central opening 34 of the dielectric layer 30 in alignment with the central opening 60 of lead frame 20 combines to form the cavity over the cladded band portion 44 of the ground plate die attach plane 40 shown in FIG. 5. The dielectric layer 30 is also formed with a cutoff, cutout, or open portion 32 in alignment with the ground lead finger portion downset tab 23 shown in FIG. 4 so that the downset tab 23 may be brought into electrical contact with the portion 42 of ground plate 40 shown in FIG. 5.

According to the method of low impedance packaging of integrated circuits, the prefabricated dielectric layer 30 is bond laminated to ground plate 40 with perimeters in alignment and with the central opening or cutout 34 in dielectric layer 30 in substantial alignment over the clad strip 44 of ground plate 40. The weld tab 23 on the ground lead finger portion of lead frame 20 is downset for subsequent electrical contact and welding and then the laminated dielectric layer 30 and ground plate 40 are brought into contact with the lead frame 20 with the central opening 60 of the lead frame in substantial alignment with the central opening 34 of the dielectric layer 30. Controlled lamination of the lead frame to the dielectric layer 30 is accomplished by pressing the three elements, namely the ground plate 40, dielectric layer 30 and lead frame 20 together to a preselected gauge thickness. The dielectric layer 30 is prepared with a thin film adhesive on each side of the dielectric and the ground plate and lead frame compress or submerge into the thin film adhesive a pre-established depth. Heat is applied for curing the lamination of the three elements. The downset tab 23 on lead frame 20 is then spot welded to the location 42 on ground plate 40.

Die attach compound is applied to the center of the clad strip 44 on ground plate 40 at the base of the cavity 16 defined by the central openings 60 and 34. An integrated circuit chip or die 14 is introduced into the cavity and bonded to the cladding strip portion 44 of ground plate 40 which functions as a die attach plane. The die attach compound is cured and interconnect or wire bonding proceeds with, for example, ball bonding of lead wire to the die pads of the integrated circuit chip followed by wedge bonding of the lead wire to the respective lead frame fingers and bonding of the down bond wire or interconnect 17 to the ground plate.

A flow coating may then be dispensed into the cavity 16 comprising, for example, RTV encapsulent 18 until the chip 44 and lead wires 15 are fully covered and protected from the environment. The RTV encapsulent is cured by temperature and humidity followed by encapsulation molding of the package as shown, for example, in FIGS. 1, 2, 2A, and 2B.

Figure 7:
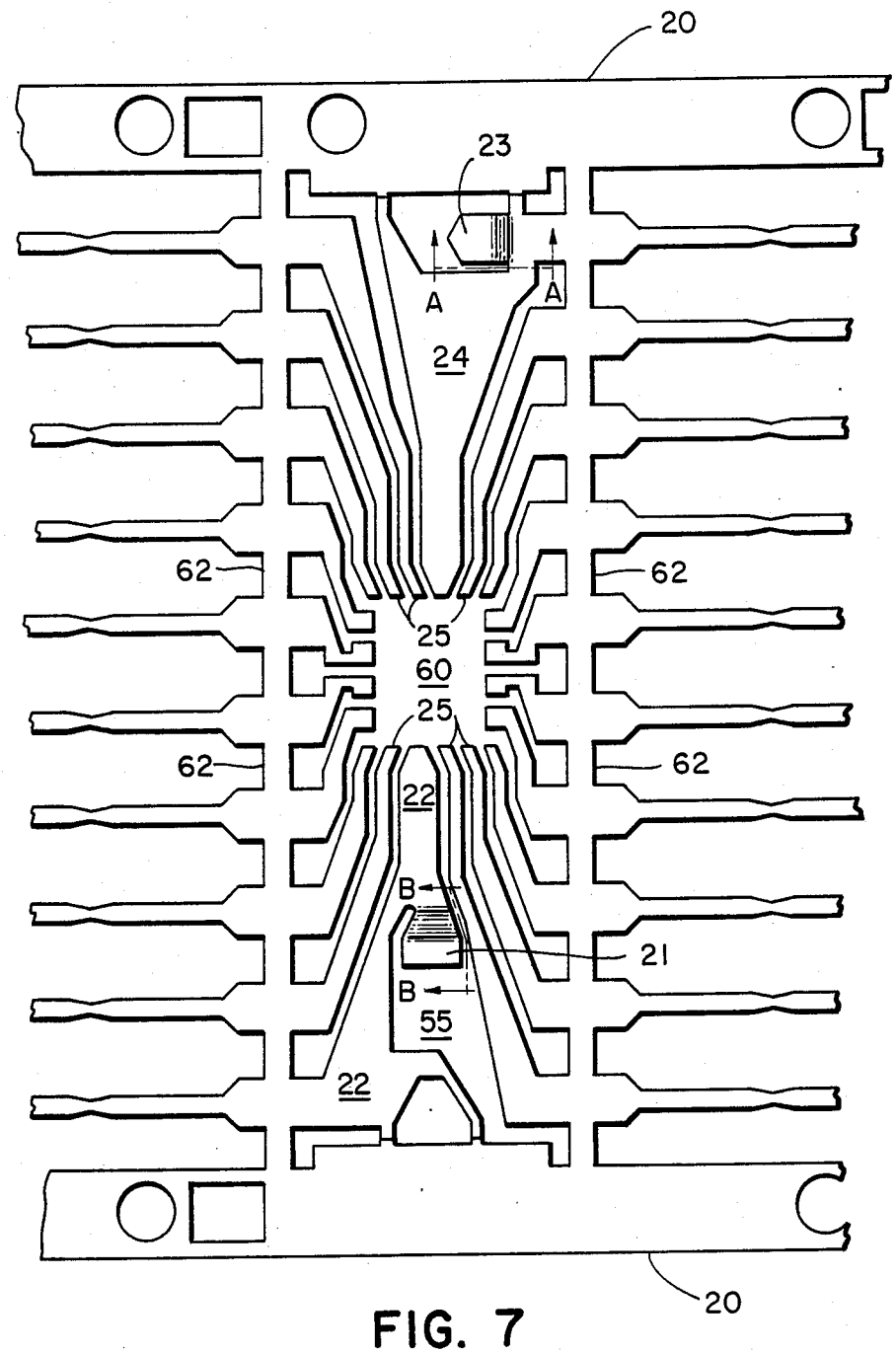
FIG. 7 is a plan view of an alternative lead frame for use in incorporating an internal decoupler or bypass capacitor in the DIP.
Figure 7A:
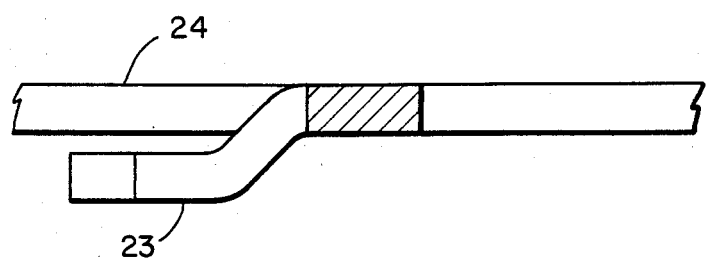
FIG. 7A is a detailed section of the lead frame in the direction of the arrows on the line A—A of FIG. 7.
Figure 7B:
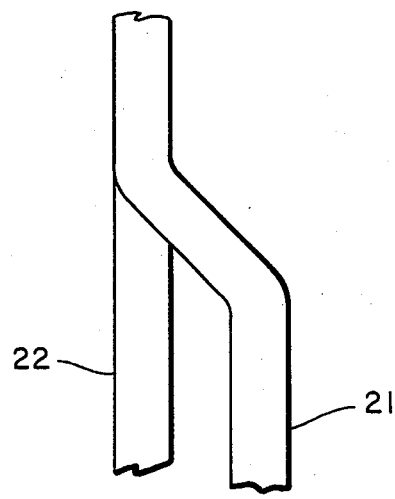
FIG. 7B is a detailed section of the lead frame in the direction of the arrows on line B—B of FIG. 7.

A low impedance lead frame for incorporating a decoupling capacitor internally within the DIP of the present invention is illustrated in FIG. 7 with elements corresponding to the lead frame of FIG. 4 having the same numeral designations. The primary difference in the lead frame of FIG. 7 is that the power lead finger portion 22 is formed with a cutout opening 55 in which the decoupling capacitor 50 is seated, and an adjacent tab 21 which is downset into the opening 55 and forms an electrical contact with the power lead for one terminal 50a of the decoupling capacitor 50 previously described with reference to FIG. 3A. The downset of tab 21 relative to the power lead finger portion 22 is shown in the detailed fragmentary side view of the FIG. 7B while the downset of tab 23 relative to the ground lead finger portion 22 is shown in the detailed fragmentary side view of FIG. 7A.

Figure 8:
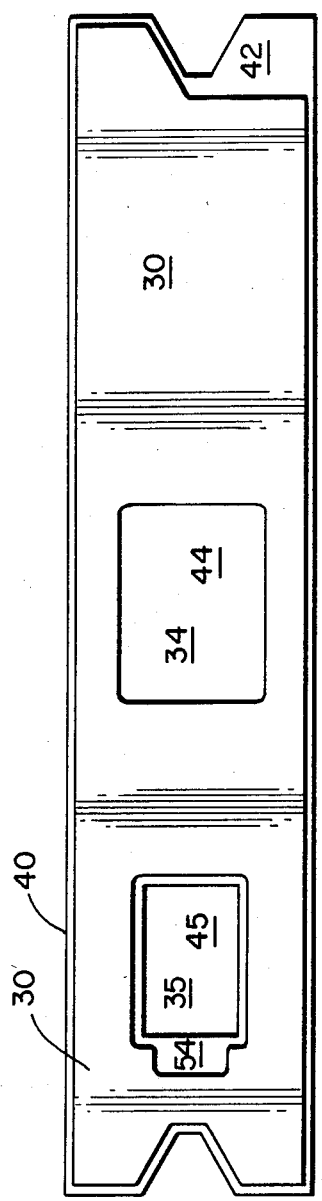
FIG. 8 is a plan view of a ground plate and adjacent molded dielectric layer for use in the DIP and packaging method with the lead frame of FIG. 7.
Figure 8A:
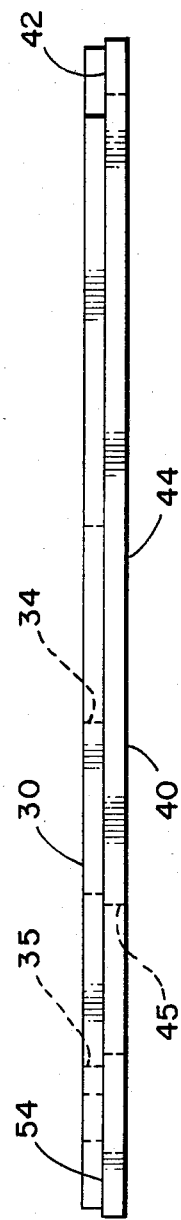
FIG. 8A is a side view of the ground plate and adjacent molded dielectric layer.

A ground plate and dielectric layer suitable for incorporation into the DIP of FIGS. 3, 3A, and 3B is illustrated in FIGS. 8 and 8A. Elements corresponding to the ground plate of FIG. 5 and dielectric layer of FIG. 6 are shown with the same numeral designations. The primary difference in the ground plate and dielectric layer ot FIGS. 8 and 8A is that the ground plate 40 is formed with an offset opening 45 offset from the center of the ground plate 40 represented by the clad strip 44. Furthermore, the dielectric layer 30 is formed with a second opening or offset opening 35 offset from the center opening 34 of the dielectric layer 30 and in alignment with the offset opening 45 of the ground plate 40. The aligned offset openings 35 and 45 are in turn constructed and arranged to be in alignment with the cutout opening 55 in the power lead finger portion 22 when the three are laminated or bonded together. Thus, cutout opening 55 and off center openings 35 and 45 form aligned openings in which the tab 21 is downset without contacting the ground plate 40. As heretofore described, a decoupling or bypass capacitor 50 is seated in these aligned openings 35, 45, 55 with one terminal 50a of the capacitor 50 in electrical contact with the downset tab 21. Because the offset opening 35 in dielectric layer 30 is slightly larger in the elongate direction than the offset opening 45 in ground plate 40, a surface contact area 54 is exposed on the ground plate for electrical contact with the other electrical terminal 50b of the capacitor 50.

In the example of FIGS. 8 and 8A, the dielectric layer 30 has been formed on the ground plate 40 directly by injection molding rather than by lamination of a prefabricated plastic layer as heretofore described. According to this method, the injection molded dielectric material fills the thru holes 46 in ground plate 40 for tight bonding and adhesion of the two elements. The lead frame is then attached to the bonded ground plate and dielectric layer by, for example, adhesive lamination or bonding of the lead frame to the dielectric layer.

Figure 9:
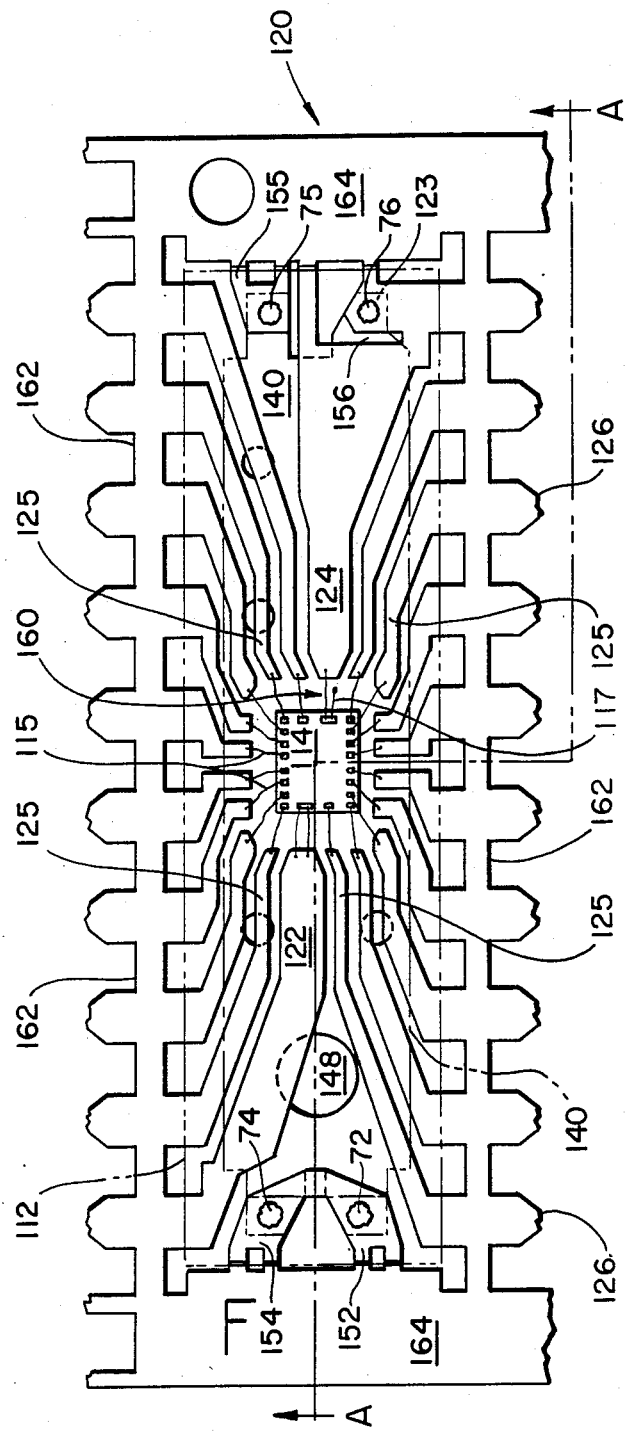
FIG. 9 is a plan view of the preferred example embodiment according to the invention in which the lead frame and ground plate are supported and maintained in a parallel spaced apart relationship by complementary spacing tab elements.
Figure 9A:
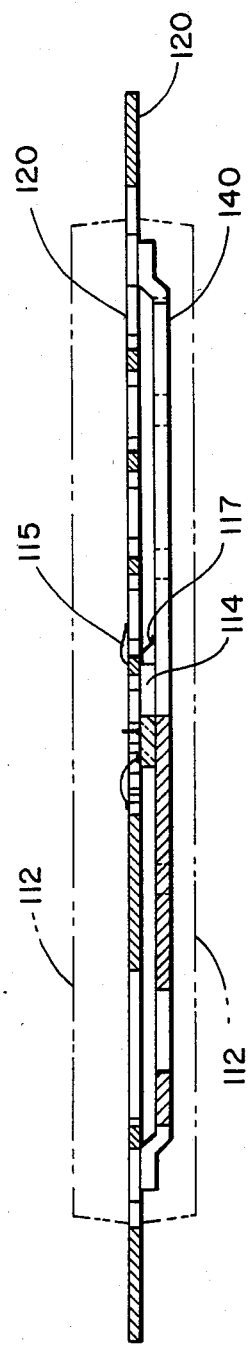
FIG. 9A is a side cross section view of the lead frame and ground plate in spaced apart coplanar relationship in the direction of the arrows on line A—A of FIG. 9 and showing the encapsulation molding in phantom outline.
Figure 9B:
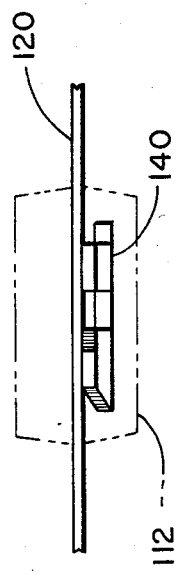
FIG. 9B is an end cross section of the lead frame and ground plate of FIG. 9 with the encapsulation molding shown in phantom outline.
Figure 10:
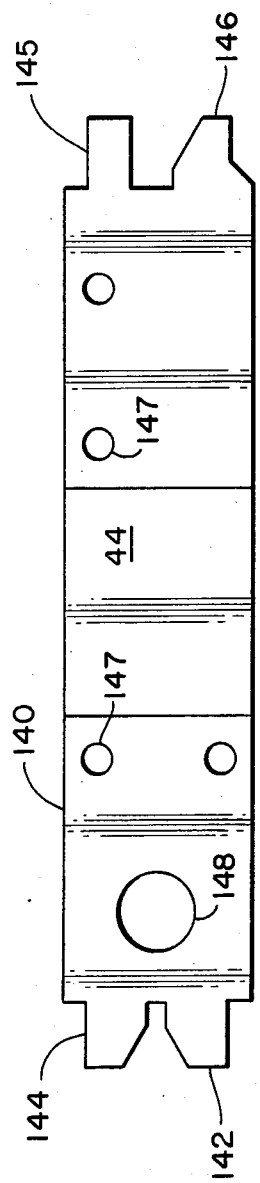
FIG. 10 is a plan view and FIG. 10A a side view of the ground plate formed with offset spacer tabs and an offset ground tab.
Figure 10A:
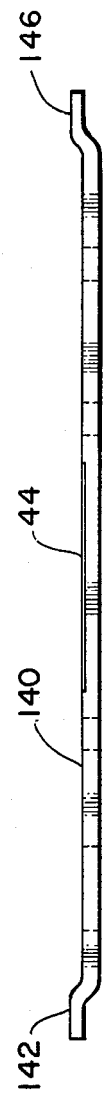

The preferred dual in-line packaging embodiment according to the present invention is illustrated in FIGS. 9 and 10. Referring to FIGS. 9, 9A, 9B, 10, and 10A, in the preferred embodiment, the lead frame 120 and ground plate are supported and maintained in coplanar spaced apart relationship by complementary spacing tab elements as shown in FIGS. 9, 9A, and 9B. As shown in FIG. 9, the lead frame 120 is formed with a plurality of electrically active lead fingers including the ground lead finger 124, power lead finger 122 and signal lead fingers 125 extending generally radially in a common plane at the perimeter of the central opening 160 of the lead frame 120. According to the invention the lead frame is formed without a die attach paddle in the central opening 160 and without paddle supports. The lead frame and lead fingers are supported by lead frame dam bars 16Z on the elongate sides of the frame and by lead frame rails 164 at the ends of the frame. The lead frame pins or prongs 126 corresponding to the electrically active lead fingers are also supported by the lead frame dams 162. During final trimming and forming of the lead frame package after encapsulation, the lead frame dams 162 and lead frame rails are cut and removed leaving the encapsulated package with depending prongs or pins.

As heretofore described with reference to FIGS. 4 and 7 the lead frame is formed with the ground lead finger 124 and power lead finger 122 having widths at least 2.5 times the width of the signal lead fingers 125 over a substantial portion of the lengths of the lead fingers thereby operating in conjunction with the ground plane for minimizing inductive impedance to the substantial ground currents and power currents which may result from simultaneous switching or operation of a number of chip logic gates at once.

As shown in FIGS. 9, 9A, and 9B, the ground plate 140 and lead frame 120 are initially joined as separate parallel planes in spaced relationship without an intermediate dielectric layer and only an air space in between. This is accomplished by forming the lead frame and ground plate with complementary spacing tab means or elements. To this end, the ground plate 140 which is substantially coextensive in area with the common plane portion of the lead frame lead fingers is formed with spacing tabs 142, 144, and 145 at the ends of the ground plate which are offset, in this case in an upward direction, for bonding to complementary locations of the lead frame as hereafter described. The tab 146 at the end of ground plate 140 is also offset in an upward direction spacing, supporting and maintaining the ground plate and lead frame in a separated parallel plane relationship, but also and primarily serving as a ground tab for bonding to the ground lead finger 124 of the lead frame as hereafter described. The major hole 148 and minor holes 147 formed in the ground plate 140 aid in distribution of the encapsulation molding compound during the encapsulation step hereafter described. Referring again to FIG. 9, the lead frame 120 is formed with spacing tab attach portions 152 and 154 at the power lead end of the lead frame. The spacing tab attach portions 152 and 154 are joined together structurally forming a support bridge joined at its ends to the rail 164 at the power lead end of the lead frame. The spacing tab attach portions 152 and 154 are isolated from the electrically active lead fingers 122, 124, and 125 so that spacing tab attach portions 152 and 154 are rendered electrically inactive during the final trimming and forming of the package when the lead frame dams 162 and rails 164 are cut away and removed. A feature and advantage of this structural arrangement according to the lead frame package of the invention is that the spacing tab attach portions 152 and 154 function only for supporting and maintaining the lead frame and ground plate in a separated parallel plane relationship without interfering in the operation of the electrically active lead fingers.

Similarly, at the ground lead end of lead frame 120 the lead frame is formed with a spacing tab attach element or portion 155 isolated from the electrically active lead fingers and joined only to the rail 164 at the ground lead end of lead frame 1Z0. As a result, upon final trimming and forming of the encapsulated package, the spacing tab attach element 155 is rendered electrically inactive serving only to support and maintain the lead frame and ground plate in a separated parallel plane relationship during the manufacturing process. It is apparent that the spacing tab attach portions 152, 154, and 155 of lead frame 120 are complementary in location to the offset spacing tabs 142, 144, and 145 formed on the ground plate 140. As a result, the spacing 142, 144, and 145 are bonded to the spacing tab attach elements 152, 154, and 155, as for example by spot welding indicated by weld spots 72, 74, and 75 of FIG. 9. The ground lead finger 124 of lead frame 120 is also formed with a ground tab attach portion 123 electrically continuous with the ground lead finger 124 and which provides a site for bonding of the offset ground tab 146 on ground plate 140 to the ground lead finger 124 as, for example, by spot welding indicated by the weld spot 76. The ground tab attach portion 123 is partially separated from the ground lead finger 124 by a notch 156 which permits resilient motion of the ground tab attach element 123 relative to ground lead finger 124 so that the offset ground tab 146 of ground plate 140 may be bonded to the ground tab attach portion 123 without substantially displacing the ground lead finger 124 from the common plane of the electrically active lead fingers.

The mechanical isolation of tab attach element 123 is important because there is no rigid spacing between the lead fingers and the ground plate and only an air space between. The common planarity of the lead fingers is therefore sensitive to a change in slope of, for example, the ground lead finger 124 caused by bonding stresses when bonding the offset ground tab 146. Maintenance of the common planarity is important in preventing subsequent stresses on the lead interconnects or wires 115 and for even distribution of the encapsulation molding compound as hereafter described.

Upon completion of bonding of the complementary spacing tabs and spacing tab attach elements, and the ground tab and ground tab attach element, the ground plate and lead frame are maintained in spaced apart coplanar relationship with only air in between as illustrated in FIG. 9A. An integrated circuit chip or die 114 is then bonded to the ground plate at the central opening 160 and lead frame 120. The ground plate 140 therefore serves as the die attach plane. Lead interconnects or wires 115 are then bonded between die pads of the integrated circuit chip or die 114 and the electrically active lead fingers. Interconnect or wire 117 is down bonded from the ground pad or terminal on chip 114 to the silver clad area 44 of ground plate 140. During wire bonding, the lead frame fingers are pushed through the interspace between the lead frame and ground plate all the way to the ground plate but then return elastically to their original position in a common plane. As an optional step, a flow coating may be dispensed or flowed over the die or chip for environmental protection of the die. Such a die coating is carefully limited to covering the die only so that the compound is not drawn by capillarity action between the lead fingers and ground plate or between the lead fingers themselves.

By means of the offset ground tab 146 and down bonding wire or interconnect 117, the ground lead finger and ground plate are electrically coupled in parallel providing in combination a wide planar ground path for minimizing inductive impedance.

According to the preferred embodiment, after the integrated circuit chip and lead wires are bonded in place on the ground plate of the spaced apart coplanar lead frame and ground plate structure, encapsulation molding compound is injected between the lead frame and ground plate to form the dielectric layer. The encapsulation molding compound 112 is also molded around the package as illustrated in FIGS. 9A and 9B. Thus, the encapsulation molding compound 112 at the same time forms the dielectric layer filling the air space between the lead frame and ground plate and covering the elements of the device while also forming the encapsulation molding around the package.

Figure 11:
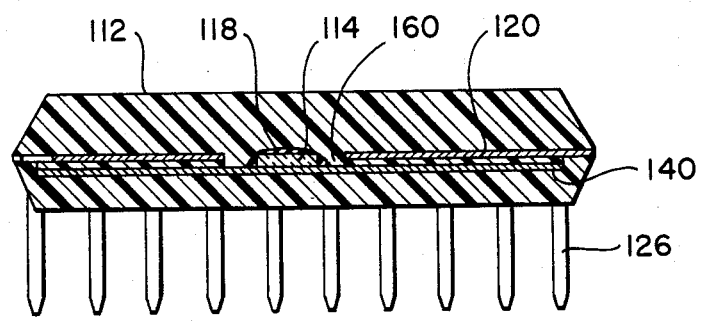
FIG. 11 is a side cross sectional view with the cross section taken along the middle of a low inductive impedance dual in-line package according to the preferred embodiment of the invention.

The completed low inductive impedance dual in-line package according to the preferred embodiment is shown in side cross section in FIG. 11 with the cross section taken along the middle of the package. The encapsulation molding compound 112 encloses the lead frame 120 and ground plate 140 and completely fills the interspace between the lead frame and ground plate. The integrated circuit chip or die 114 is shown bonded to the ground plate 140 which forms the die attach plane. The chip 114 is located in the central opening 160 of lead frame 120. A small amount of RTV rubber flow coating compound 118 coats only the chip or die 114 for environmental protection of the die. The central opening and space around the die 114 is otherwise filled by the encapsulation molding compound 112 which is injected into the interspace between the lead frame and ground plate during encapsulation molding of the package. Distribution of the encapsulation molding compound between and around all of the elements of the package is facilitated by strategic selection of injection locations in the mold around the package elements.

The final trimming and forming steps resulting in the package of FIG. 11 include dam bar removal, de-flashing, cutting loose the ends of the leads or pins 126, forming and bending leads or pins 126 downward, and derailing or removing the rails from the ends of the lead frame. By this last step the spacer tab attach portions of the lead frame are rendered electrically inactive having served their purpose of supporting, maintaining, and spacing the lead frame and ground plate in a separated parallel plane relationship during die attaching of the integrated circuit chip to the ground plate, bonding of lead wire between the die pads of the chip and the lead frame fingers, the optional step of flow coating the surface of the die for environmental protection and finally, encapsulation molding of the elements of the package including injection of the encapsulation molding compound between the lead frame and ground plate to form the intermediate dielectric layer. Following the trimming and forming steps, the end result is the low impedance dual in-line package according to the preferred embodiment as illustrated in FIG. 11.

By the low impedance packaging method, lead frame and DIP, according to the present invention, the thermal resistance of the package to heat dissipation is decreased by more than 50%, increasing the life of the chip. At the same time the ground plane configuration decreases ground bounce and recovery by dramatically lowering the inductive input impedance of the package for faster operating speed. The noise immunity of the package is also increased as signal fields are imaged in the ground plate rather than cross coupled to adjacent leads. The stability of the package may be further increased by incorporating an internal decoupling or bypass capacitor to resist voltage change of the ground relative to $V_{cc}$ caused by power supply current transients.

While the invention has been described with reference to examples of a 20 pin dual in-line integrated circuit package, it is applicable to DIP configuration packages generally ranging from, for example, 16 to 40 pins. With lower numbers of leads and lead frame fingers, wider lead configurations may be used to minimize inductance. With greater than 40 leads and longer DIP's, the DIP is too long to bring in the power and ground currents from the ends and achieve high speed operation and instead the power and ground leads are typically brought in from the center of the sides. Furthermore, leaded plastic chip carriers are being used in place of DIP's, for example, as described in "The Leaded Plastic Chip Carrier—Its Reliability and Use" by W. L. Brodsky, F. D. Parker and J. W. Stafford of Bell Laboratories, Murray Hill, New Jersey, published in the *Proceedings of the Technical Program of the International Microelectronics Conference*, NEPCON WEST, Anaheim, California, pp. 248–257, Feb. 24–26, 1981, and "Automated Packaging of a Premolded Chip Carrier" by Dimetri Grabbe, AMP, Inc., Harrisburg, Pennsylvania and Alan Kaizer of the Jade Corporation, Huntingdon Valley, Pennsylvania presented at NEPCON, 1979. The present invention, however, permits extension of the DIP art and technology into the realm of the faster bipolar chips presently available, and the invention is intended to cover all variations and equivalents within the scope of the following claims.

We claim:

1. A low inductive impedance dual in-line package for an integrated circuit die comprising:
   a lead frame formed with a plurality of electrically active lead fingers lying in a common plane and including a ground lead finger, said lead frame formed with a central opening without a die attach paddle and without paddle support fingers;

a ground plate forming a die attach plane parallel with said lead frame for supporting an integrated circuit die attached to one side of the ground plate, said ground plate having an area substantially coextensive with the area of the common plane of the lead fingers and a die attach side facing the lead frame, said ground plate being spaced from the lead frame for imaging signal fields of the lead fingers in the ground plate;

a dielectric layer formed between the lead frame and ground plate;

electrical contact means providing parallel electrical coupling between the ground lead finger of the lead frame and the ground plate thereby providing a ground path through the ground plate with planar configuration to minimize inductive impedance to ground current and to minimize cross coupling of signals between the electrically active lead fingers;

an integrated circuit die bonded to the die attach side of the ground plate and aligned within the central opening of the lead frame; said integrated circuit die being formed with a ground terminal pad;

and interconnect lead wire means bonded between the ground terminal pad of the integrated circuit die and the ground plate.

2. The package of claim 1 wherein:

the lead frame (120) is formed with a plurality of first spacing tab means (152, 154, 155) isolated from the electrically active lead fingers (122, 124, 125) so that the first spacing tab means (152, 154, 155) are rendered electrically inactive upon final trimming and forming of the package;

the ground plate (140) is formed with a plurality of second spacing tab means (142, 144, 145) corresponding to the respective first spacing tab means (152, 154, 155); and said respective first (152, 154, 155) and second (142, 144, 145) spacing tab means are joined together to support the lead frame (120) and ground plate (140) in said spaced parallel relationship without electrical contact between the ground plate (140) and the electrically active lead fingers (122, 124, 125) through the first (152, 154, 155) and second (142, 144, 145) spacing tab means.

3. The package of claim 2 wherein:

the plurality of first spacing tab means comprise spacing tab attach portions (152, 154, 155) formed in the plane of the electrically active lead fingers (122, 124, 125) and isolated from the electrically active lead fingers so that the spacing tab attach portions (152, 154, 155) are rendered electrically inactive upon final trimming and forming of the package; and the plurality of second spacing tab means comprise offset spacing tabs (142, 144, 145) formed in the ground plate (140) at locations corresponding to the locations of the spacing tab attach portions (152, 154, 155) for bonding to the spacing tab attach portions thereby supporting and maintaining the lead frame (120) and ground plate (140) in spaced parallel relationship.

4. The package of claim 3 wherein:

the lead frame (120) is formed with first ground tab means (123) on the ground lead finger (124) of the lead frame (120) and electrically continuous with the ground lead finger (124); and the ground plate (140) is formed with second ground tab means (146) corresponding to the first ground tab means (123), said first (123) and second (146) ground tab means being joined to provide electrical contact between the ground plate (140) and ground lead finger (124) and to provide additional support between the spaced parallel ground plate (140) and lead frame (120).

5. The package of claim 4 wherein:

the first ground tab means comprises a ground tab attach portion (123) electrically continuous with the ground lead finger (124) and lying in the common plane of the electrically active lead fingers (122, 124, 125); and the second ground tab means comprises an offset ground tab (146) connected to the ground plate (140) and offset to a plane spaced from the ground plate, said offset tab being bonded to the ground tab attach portion (123) of the ground lead finger (124).

6. The package of claim 5 wherein the ground tab attach portion (123) is notched relative to the ground lead finger (124) for resilient bending and elastic recovery of the ground tab attach portion (123) relative to the ground lead finger (124) so that the offset ground tab (146) may be bonded to the ground tab attach portion (123) without substantially displacing the ground lead finger (124) from the common plane of the electrically active lead fingers (122, 124, 125).

7. The package of claim 1 wherein:

the lead frame (20, 120) is formed with first ground tab means (23, 123) electrically continuous with the ground lead finger (24, 124) of the lead frame (20, 120); and the ground plate (40, 140) is formed with second ground tab means (42, 146) corresponding to the first ground tab means (23, 123), said first (23, 123) and second (42, 146) ground tab means being joined to provide electrical contact between the ground plate (40, 140) and ground lead finger (24, 124).

8. The package of claim 7 wherein:

said first ground tab means comprises an offset tab (23) connected to the ground lead finger (24) and offset to a plane spaced from the ground lead finger; and the second ground tab means comprises a tab attach location (42) on the ground plate (40) to which the offset tab (23) of the ground lead finger (24) is bonded for electrical contact between the ground lead finger (24) and ground plate (40).

9. The package of claim 7 wherein one of said first (23, 123) and second (42, 146) ground tab means comprises an offset tab (23, 146) and the other of said first (23, 123) and second (42, 146) ground tab means comprises a tab attach location (42, 123) to which the offset tab (23, 146) is bonded for electrical contact between the ground lead finger (24, 124) and ground plate (40, 140).

10. The package of claim 1 wherein the dielectic layer formed between the lead frame and ground plate comprises a dielectric sheet (30) formed with a central opening (34) in alignment with the central opening (60) of the lead frame (20) for defining a cavity over the ground plate (40) for receiving the integrated circuit die (14) bonded to the ground plate.

11. The package of claim 10 further comprising:

lead interconnect means bonded between said integrated circuit die and the electrically active lead fingers;

flow coating means environmentally protecting said die;

and encapsulation means substantially around said package.

12. The package of claim 10 wherein:

said lead frame comprises a power lead finger, said ground lead finger, and a plurality of signal lead fingers, said lead fingers extending radially in a common plane at the perimeter of the central opening in said lead frame, said power lead finger (22) being formed with an opening (55) and a downset tab (21) adjacent said opening (55) offset to a plane spaced from the power lead finger (22);

the dielectric sheet (30) is formed with a second opening (35) in alignment with the power lead finger opening (55);

the ground plate (40) is formed with an opening (45) in alignment respectively with the dielectric sheet second opening (35) and the power lead finger opening (55), said aligned openings being constructed and arranged so that the downset tab (21) of the power lead finger (22) is offset in said aligned openings without contacting the ground plate (40);

and further comprising a decoupling capacitor seated in the aligned power lead finger opening (55), dielectric sheet second opening (35) and ground plate opening (45), said decoupling capacitor having a first terminal in electrical contact with the power lead finger downset tab (21) and a second terminal in electrical contact with the ground plate (40).

13. The package of claim 12 wherein the dielectric sheet second opening (35) is larger in area than the aligned opening (45) in the ground plate (40) thereby leaving a contact surface on the ground plate (40) for the second terminal of the decoupling capacitor.

14. The package of claim 1 wherein the dielectric layer formed between the lead frame (120) and ground plate (140) comprises encapsulation molding compound introduced between the lead frame and ground plate, said encapsulation molding compound also molded around the package.

15. The package of claim 1 further comprising:

lead interconnect means bonded between said integrated circuit die and the electrically active lead fingers of the lead frame;

flow coating material formed over the die for environmentally protecting said die;

and encapsulation molding compound introduced between the ground plate (140) and the lead frame (120) to form said dielectric layer, said encapsulation molding compound also formed substantially around the package.

16. The package of claim 1 wherein the electrically active lead fingers of said lead frame comprise a power lead finger, said ground lead finger, and a plurality of signal lead fingers, and wherein said ground lead finger and power lead finger are at least 2.5 times wider than the narrowest portion of the signal lead fingers, whereby the ground lead finger and power lead finger in cooperation with the ground plate minimize inductive reactance to power currents and ground currents.

17. The package of claim 1 wherein said lead frame is formed with a power lead finger having a cutout opening and a downset tab adjacent to said opening said downset tab being offset to a plane spaced from the lead frame;

wherein the ground plate is formed with an opening in alignment with the cutout opening in the power lead finger, said downset tab of the power lead finger extending into said aligned opening without contacting the ground plate;

and further comprising decoupling capacitor means seated in said cutout opening and aligned opening with one terminal of the decoupling capacitor means in electrical contact with the downset tab of the power lead finger and the other terminal of the decoupling capacitor means in electrical contact with the ground plate adjacent said aligned opening;

said dielectric layer being formed around said decoupling capacitor means.

18. A low inductive impedance dual in-line package for an integrated circuit chip or die comprising:

a lead frame (120) formed with a central opening (160) and a plurality of electrically active lead fingers (122, 124, 125) extending radially at the perimeter of the central opening (160) substantially in a common plane of the lead frame, said lead frame (120) formed without a die attach paddle in the central opening and without paddle supports, said electrically active lead fingers including a ground lead finger (124) formed with first ground tab means (123) electrically continuous with the ground lead finger (124), said lead frame also formed with a plurality of first spacing tab means (152, 154, 155) isolated from the electrically active lead fingers so that the plurality of first spacing tab means (152, 154, 155) are rendered electrically inactive upon final trimming and forming of the package;

a ground plate (140) forming a die attach plane parallel with and spaced from the common plane of the lead frame (120) for supporting an integrated circuit die on the side of the ground plate facing the lead frame and for imaging signal fields of the electrically active lead fingers in the ground plate, said ground plate being substantially coextensive in area with the common plane of the lead frame, said ground plate (140) formed with a plurality of second spacing tab means (142, 144, 145) corresponding to the respective plurality of first spacing tab means (152, 154, 155) on the lead frame (120), said first and second spacing tab means being joined to support the lead frame (120) and ground plate (140) in spaced apart coplanar relationship, said ground plate (140) also formed with a second ground tab means (146) complementary with the first ground tab means (123) on the ground lead finger (124) of the lead frame (1200, said first (123) and second (146) ground tab means being electrically joined for electrical contact between the ground lead finger (124) and ground plate (140) so that the ground lead finger and ground plate provide parallel coupled ground current paths thereby providing a ground lead with planar configuration to minimize inductive impedance to ground current and to minimize cross coupling between the electrically active lead fingers of the lead frame;

and a dielectric layer formed between the lead frame and ground plate.

19. The package of claim 18 wherein:

the plurality of first spacing tab means (153, 154, 155) on the lead frame (120) conprise a plurality of spacing tab attach portions (152, 154, 155) lying in the common plane of the electrically active lead fingers (122, 124, 125) and relatively isolated from the electrically active lead fingers whereby the plurality of spacing tab attach portions (152, 154, 155) are rendered electrically inactive upon final trimming and forming of the package;

the plurality of second spacing tab means (142, 144, 145) on the ground plate (140) comprise a plurality of offset spacing tabs (142, 144, 145) at locations on the ground plate corresponding to the locations of the respective plurality of spacing tab attach portions (152, 154, 155) on the lead frame, said offset spacing tabs (142, 144, 145) being offset to a plane spaced from the ground plate and bonded to the spacing tab attach portions (152, 154, 155) of the lead frame (120) for supporting and spacing the lead frame (120) and ground plate (140) in spaced parallel relationship;

the first ground tab means (123) on the ground lead finger (124) comprises a ground tab attach portion (123) electrically continuous with the ground lead finger (124) and lying in the common plane of the electrically active lead fingers (122, 124, 125); and the second ground tab means (146) on the ground plate (140) comprises an offset ground tab (146) offset to a plane spaced fron the ground plate and bonded to the ground tab attach portion (123) of the ground lead finger (124) for electrical contact between the ground plate (140) and ground lead finger (124) of the lead frame.

20. The package of claim 18 wherein said dielectric layer comprises encapsulation molding material introduced between the ground plate and lead frame, said encapsulation molding material also formed around the package.

21. The package of claim 19 wherein the groundtab attach portion (123) is notched relative to the ground lead finger (124) for resilient bending and elastic recovery relative to the ground lead finger whereby the offset ground tab may be bonded to the ground tab attach portion without substantially displacing the ground lead finger from the common plane of the lead fingers.

22. An improved lead frame (20, 120) for low inductance dual in-line packaging of an integrated circuit die, said improved lead frame having lead frame dam means (62, 162) along the sides of the lead frame and rail means (164) at the ends of the lead frame for supporting a plurality of lead fingers, a plurality of electrically active lead fingers (22, 24, 25; 122, 124, 125) supported by said dam means (62, 162) and rail means (164) and comprising a power lead finger (22, 122), a ground lead finger (24, 124), and a plurality of signal lead fingers (25, 125), said lead frame (20, 120)formed with a central opening (60, 160) with said lead fingers extending generally radially in a common plane at the perimeter of said central opening, and a plurality of pins or leads (26, 126) supported by the lead frame dam means (62, 162) correspomding to the respective lead fingers, wherein the improvement comprises:

said lead frame (20, 120) being formed without a die attach paddle in the central opening of the lead frame and without die attach paddle supports;

said power lead finger (22, 122) and ground lead finger (24, 124) being formed at least 2.5 times wider than the signal lead fingers (25,125) along a portion of the respective lengths of said lead fingers thereby reducing inductive impedance to power current and ground current;

said ground lead finger (24, 124) being formed with first ground tab means (23, 123) electrically continuous with the ground lead finger (24, 124) for electrical contact with a ground coupling.

23. The improved lead frame of claim 22 wherein the first ground tab means comprises a ground tab attach portion (123) electrically continuous with the ground lead finger (124) and lying in the common plane of the electrically active lead fingers (122, 124, 125), said ground tab attach portion (123) formed with a notch relative to the ground lead finger for resilient elastic bending and recovery of the ground tab attach portion relative to the ground lead finger whereby a ground coupling may be bonded to the ground tab attach portion without substantially displacing the ground lead finger from the common plane of the lead fingers.

24. The lead frame of claim 22 further comprising a plurality of first spacing tab means (152, 154, 155) isolated from the electrically active lead fingers (122, 124, 125) whereby the first spacing tab means (152, 154, 155) may be rendered electrically inactive upon final trimming and forming of package.

25. The lead frame of claim 24 wherein the plurality of first spacing tab means comprise a plurality of spacing tab attach portions (152, 154, 155) for bonding of spacing tabs (142, 144, 145) to the lead frame at electrically inactive portions of the lead frame.

26. The lead frame of claim 22 wherein the power lead finger (22) is formed with a cutout opening (55) for accommodating a decoupling capacitor, said power lead finger (22) is also formed with a terminal tab (21) adjacent to said cutout opening 55 for downset or offset bending downward and for providing an electrical contact surface for one terminal of a decoupling capacitor.

27. The lead frame of claim 22 wherein the first ground tab means (23) of the ground lead finger (24) comprises a tab (23) for offset bending relative to the common plane of the lead fingers (22, 24, 25) for contacting and bonding a ground coupling.

* * * * *